(12) United States Patent
Mok et al.

(10) Patent No.: US 6,837,293 B1
(45) Date of Patent: Jan. 4, 2005

(54) HEATED NOZZLE ASSEMBLY

(76) Inventors: Swee M. Mok, 278 Spring Creek Cir., Schaumburg, IL (US) 60173-2154; Janice M. Danvir, 1317 N. Harvard, Arlington Heights, IL (US) 60004; Chi-haur Wu, 9052 E. Prairie Rd., Skokie, IL (US) 60203

(*) Notice: Subject to any disclaimer, the term of this patent is extended or adjusted under 35 U.S.C. 154(b) by 0 days.

(21) Appl. No.: 10/462,160

(22) Filed: Jun. 16, 2003

(51) Int. Cl.⁷ ............................................. B32B 31/00
(52) U.S. Cl. ..................... 156/571; 156/572; 156/584; 901/40; 29/743; 414/737
(58) Field of Search .................. 156/556, 571, 156/572, 344, 584; 901/40; 29/743; 414/737

(56) References Cited

U.S. PATENT DOCUMENTS

| | | | | |
|---|---|---|---|---|
| 4,890,241 A | * | 12/1989 | Hoffman et al. | 700/255 |
| 4,980,971 A | * | 1/1991 | Bartschat et al. | 29/833 |
| 5,033,783 A | * | 7/1991 | Izumi et al. | 294/64.1 |
| 5,164,037 A | * | 11/1992 | Iwami et al. | 156/584 |
| 5,172,949 A | * | 12/1992 | Nagai et al. | 294/64.1 |
| 5,671,530 A | * | 9/1997 | Combs et al. | 29/834 |
| 5,894,657 A | * | 4/1999 | Kanayama et al. | 29/740 |
| 5,971,250 A | * | 10/1999 | Safabakhsh et al. | 228/102 |
| 6,129,476 A | * | 10/2000 | Berman et al. | 403/229 |

\* cited by examiner

*Primary Examiner*—Mark A. Osele
(74) *Attorney, Agent, or Firm*—Renee Michelle Larson Leveqne

(57) ABSTRACT

An interface block (300) carries a removable electrical connection (310, 312) that can be quickly connected and removed from a high speed machine for picking and placing electronic components. The interface block is attached to a vacuum ported tool changer (200) which further couples to a heated end effector (100) to create a removable heated nozzle assembly (50). The entire assembly can be easily plugged into and removed from a high speed placement machine.

15 Claims, 2 Drawing Sheets

HEATED NOZZLE ASSEMBLY

CROSS REFERENCE TO RELATED APPLICATIONS

This application is related to pending U.S. application Ser. No. 10/328,231, filed Dec. 8, 2002, by Becher et al., entitled "REMOVABLE HEATED END EFFECTOR," and assigned to Motorola, Inc.

The U.S. Government has a paid-up license in this invention and the right in limited circumstances to require the patent owner to license others on reasonable terms as provided for by the terms of Grant No. 70NANB8H4007 awarded by NIST.

FIELD OF THE INVENTION

This invention relates generally to automated placement of small electronic components. More particularly, this invention relates to the use of a easily removable heated end effector on placement systems to preheat an adhesive on electronic components.

BACKGROUND OF THE INVENTION

"Chip shooters" or "Pick-and-Place" machines rapidly place small electronic components such as resistors, capacitors and integrated circuit packages on a printed circuit board. The placement of components on the board can reach rates of more than 40,000 chips per hour. These machines pick up and accurately locate the component on the end of a vacuum nozzle. Chip shooters use one of two basic designs to place components. The most common is a turret drive with multiple heads around the outside of the turret. A feeder carriage is placed in the back of the machine that moves back and forth to put the correct component under the turret. As the turret spins, the component is picked up from the feeder carriage and is brought to the front for placement. The advantage of the turret design is speed since many components can be on the turret in process at the same time. The circuit board being assembled moves around under the front of the turret to position the component correctly. A second type of chip shooter is a gantry system. The circuit board is held stationary, or moved in only one axis, and the head goes to the feeder to get the component and moves to the proper location for placement.

When placing flip chip integrated circuits that are pre-coated with an underfill adhesive, solder flux or solder paste is not used to hold the chip in place during reflow, as with typical surface mount components. Instead the pre-applied underfill material is heated to soften it and create a tacky surface to hold the chip in place as the board is transported into the reflow oven. Novel techniques such as a soft beam laser, radiant or ultraviolet heating for the softening step after component pick and placement are being discussed as a potential techniques for heating up the flip chip. However, these techniques have not been proven to be effective for mass production. An alternative approach is to heat the board with infra-red energy prior to entering the placement cell. While this technique can easily be integrated in an existing pick and place platform, it causes the solder paste on the printed circuit boards to dry out. Therefore a method of heating the die during the pick and place step is highly desirable to provide a complete solution for the implementation of the precoated chip in high volume manufacturing.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE INVENTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention. The terms a or an, as used herein, are defined as one or more than one. The term plurality, as used herein, is defined as two or more than two. The term another, as used herein, is defined as at least a second or more. The terms including, and/or having, as used herein, are defined as comprising (i.e., open language).

A replaceable heated end effector can be quickly connected and disconnected to a vacuum ported tool changer on a high speed machine to create a heated nozzle assembly for picking and placing electronic components. The heated end effector is made up of an adapter flange, a heater plate and a heated tip. The heater plate contains one or more heating elements to heat up the tip. The upper side of the adapter flange mates with the vacuum ported tool changer so as to be easily removable. The adapted flange also has electrical contacts to supply power to the heating elements on the heater plate. The heated tip has a vacuum pickup portion that is designed to pick up the electronic components and heat them while they are being transported to the placement location. There are holes or apertures in the adapter flange, the heater plate and the heated tip that port the vacuum from the tool changer to the vacuum pickup tip. The adapter flange, the heater plate and the heated tip are all fastened together in close proximity to form a modular unit that can be easily and removably connected to the tool changer. An interface block is mounted on the tool changer to make the entire assembly easily removable from the high speed placement machine. The interface block carries one or more connectors that establish removable electrical connections between the heated nozzle assembly and the high speed placement machine. The connectors mate with respective connectors on the high speed placement machine so that the entire heated nozzle assembly (including the tool changer) can be quickly and easily removed and replaced.

Figure 1:
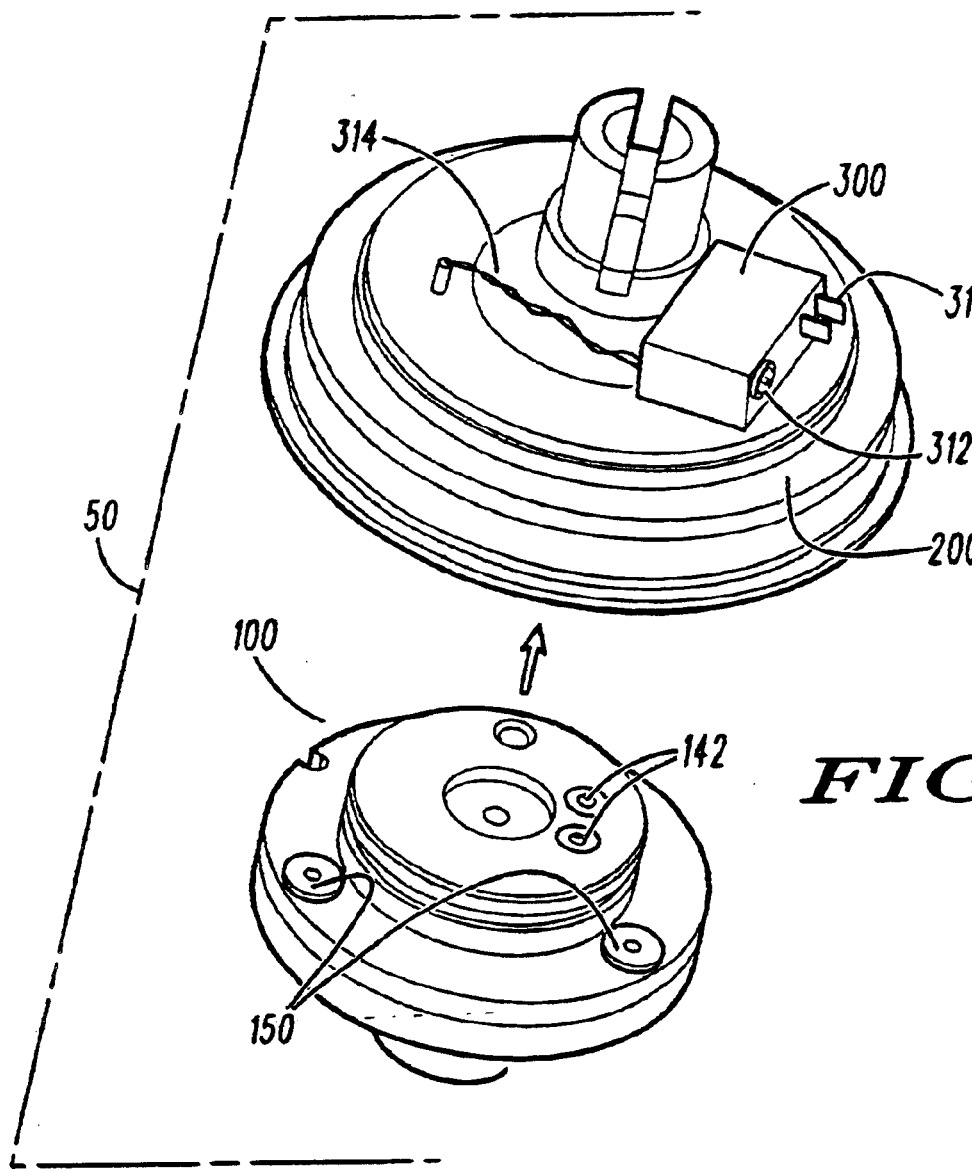
FIG. 1 is an isometric view showing an assembled heated end effector ready to mate with a tool changer for a placement machine in accordance with the present invention.

Referring now to FIG. 1, in which our preferred embodiment is displayed, the heated nozzle assembly 50 contains three main parts: a heated end effector 100, a vacuum ported tool changer 200, and an interface block 300. The vacuum ported tool changer 200 is a conventional component of any of a number of commercial robotic placement machines or high speed pick and place machines. Since the tool changer is intended by the placement machine manufacturer to be removable and replaceable in the event of damage or normal wear, it is advantageous to configure the heated nozzle assembly 50 to likewise be easily removable. Since the heated end effector 100 is heated by an electrical heating element, one or more electrical connections between the heated nozzle assembly 50 and the placement machine are required. The interface block 300 is mounted on the tool changer 200 and provides mechanical support for one or more removable connectors 310 that plug or otherwise removably mate with a respective connector (not shown) on the component placement machine. Although the drawings depict two spade terminal plugs, one of ordinary skill in the art will understand a single plug can be used, and that other types of mating connectors can also be used, such as flush mount connections, surface mount connectors, conductive elastomeric connectors, co-axial connectors, as well as pin jacks such as RCA connectors, phono plugs, etc. All of the above connectors, as well as others, enable the entire heated nozzle assembly 50 to be quickly, easily, and safely removed from the robot or placement machine when wear or damage has occurred, or when other types of conventional nozzles are used in the placement machine. The interface block 300 also provides mechanical support for routing of the electrical circuitry between the connectors 310 and a force compliant electrical contact assembly 142 in the heated end effector. Routing the circuits is accomplished by, for example, discrete hard wiring, printed circuit boards, or flexible circuitry. An alternate embodiment for providing electrical connections is to couple a discrete plug module 312 on the top or sides of the interface block, and rout wires 314 to their destination. The various types of removable electrical connections can be used to provide, for example, AC or DC power and ground to the heating elements, temperature measurement via thermocouple or thermister probes, pressure or vacuum sensing, and optical sensing. Although the drawing depicts coaxial and parallel connectors, one can also employ a single style of connectors, and in this case, to aid a human operator in making the proper connections, one would employ, for example a male plug for power and ground and a female plug for temperature measuring.

Figure 2:
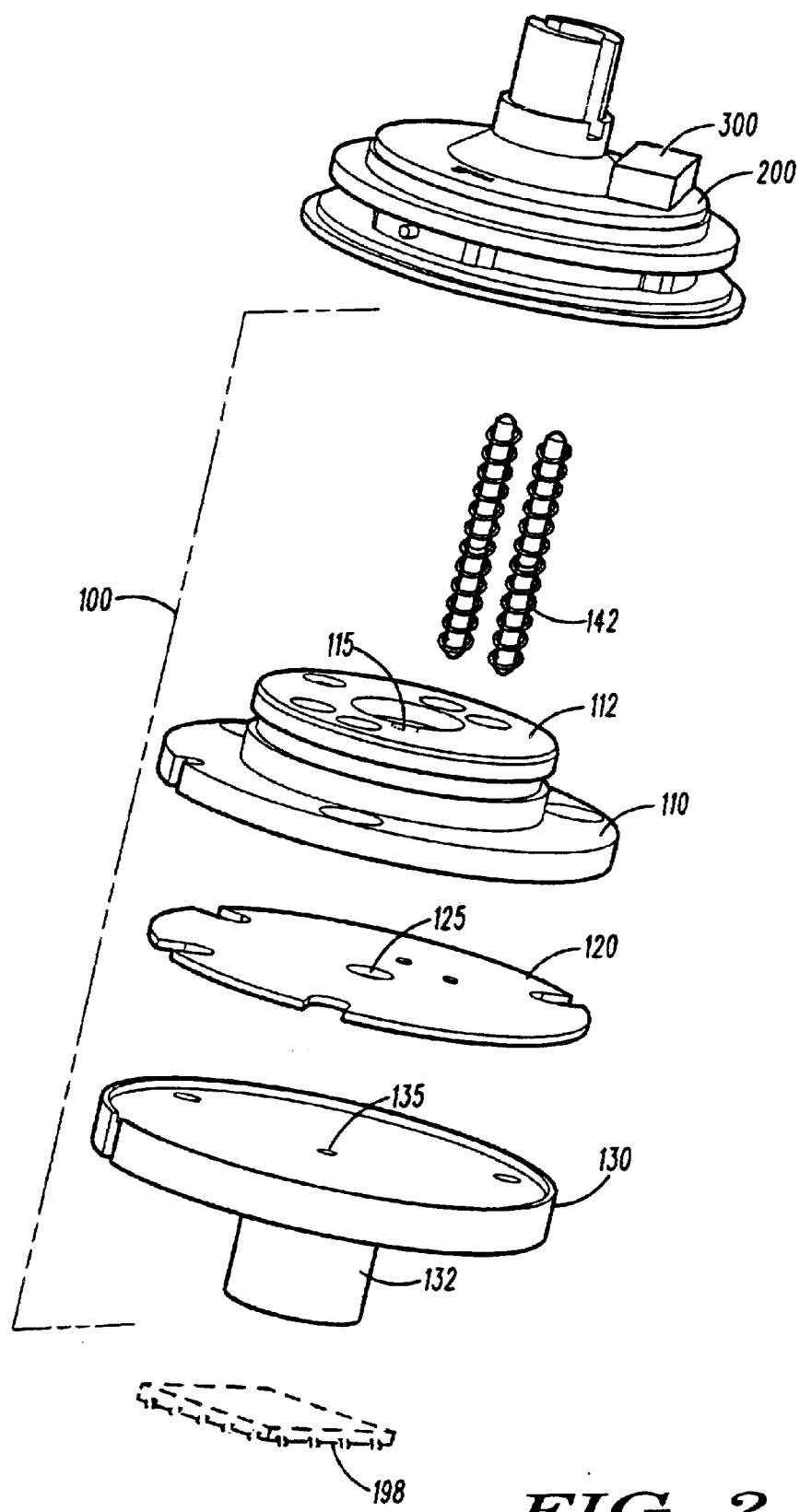
FIG. 2 is an exploded isometric view of the heated nozzle assembly of the present invention.

Referring now to FIG. 2, the replaceable heated end effector 100 contains three main parts: an adapter plate or flange 110, a heater plate 120 and a heated vacuum tip 130. The aluminum adapter flange 110 is arranged such that an upper side 112 mates with a corresponding portion of the vacuum ported tool changer 200. A heater plate 120 is situated directly below the adapter flange 110 and arranged so that it mates with the flange. The heater plate 120 contains one or more heating elements that are electrically coupled to a force compliant electrical contact assembly 142 located in the adapter flange 110. The force compliant electrical contact assembly 142 includes two telescoping electrically conductive pins surrounded by a coil spring, the entire assembly captured in an insulative housing. The force compliant electrical contact assembly provides constant force to both the heating element and the power/ground contacts in the interface block even when they do not maintain a constant distance from each other, that is, the assembly is tolerant of mechanical inaccuracies in the heated nozzle assembly. The adapter flange 110 and the heater plate 120 both mate with and are attached to a heated tip 130 that has a vacuum pickup portion 132 that is designed in the manner of conventional vacuum pickup tool tips, to apply a vacuum force to pick up the electronic components 198. A vacuum is transmitted to the tip via a port or aperture 135 in the tip. This port is arranged to communicate with a corresponding aperture 125 in the heater plate 120, and the heater aperture 125 is also arranged to communicate with a corresponding aperture 115 in the adapter flange 110. All three apertures 135, 125 and 115 also are arranged to communicate with the vacuum that is ported to the tool changer 200. The heated tip 130 is preferably made of aluminum or other material that is light and highly thermally conductive, so as to quickly conduct heat to the electronic component 198 that is being picked up. A thermocouple (not shown) embedded in the end effector assembly monitors the temperature of the heated tip. When the heated tip 132 makes contact with the electronic component 198 such as a flip chip that has been pre-coated with an underfill material and vacuum is applied through the apertures 115, 125 and 135, the component is held against the vacuum pickup portion 132 by vacuum force. While in intimate contact with the heated tip, a finite amount of heat is transferred to the flip chip and the pre-applied underfill material on the flip chip softens to become tacky. This, in turn, secures the chip when it is placed on the printed circuit board, to maintain alignment as the board is transported into the reflow oven. Referring back to FIG. 1, the three main parts of the end effector 100 are held together, for example, by fastening means 150, such as rivets, screws, adhesives, welds, etc.

In summary, and without intending to limit the scope of the invention, a replaceable heated nozzle assembly can be quickly and easily connected and removed from a conventional high speed machine for picking and placing electronic components. Plugs or other type of connectors that provide a temporary and removable electrical connection are carried by an interface block that is coupled to the nozzle assembly. Our invention adds an additional degree of flexibility and robustness to prior art end effectors that were hard wired into the placement machines. Those skilled in the art will recognize that the present invention has been described in terms of exemplary embodiments based upon one type of tool changer used in a high speed placement machine or chip shooter. However, the invention should not be so limited, since other variations will occur to those skilled in the art upon consideration of the teachings herein. For example, while we have described and shown in the drawings the use of a cubic 'interface block', other configurations of this element can of course be visualized by those skilled in the art, such as miniature connectors, a 'block' that is integral to the tool changer, etc. Accordingly, it is intended that the present invention embrace any and all alternatives, modifications and variations as fall within the scope of the appended claims.

What is claimed is:

1. In a high speed machine for picking and placing electronic components, a heated nozzle assembly, comprising:

a vacuum ported tool changer, a replaceable heated end effector, and an interface block; and the interface block mechanically mounted on the vacuum ported tool changer and electrically connected to the replaceable heated end effector, and having one or more electrical contacts arranged to be removably connected to the high speed machine.

2. The heated nozzle assembly as described in claim 1, wherein the one or more electrical contacts comprise pluggable connections.

3. The heated nozzle assembly as described in claim 1, wherein the one or more electrical contacts comprise surface mount connections.

4. The heated nozzle assembly as described in claim 1, wherein the one or more electrical contacts are selected from the group consisting of power, ground, temperature measurement, pressure sensing, and optical sensors.

5. The heated nozzle assembly as described in claim 4, wherein the power and ground connections are a male connector, and wherein the temperature measurement connection is a female connector.

6. The heated nozzle assembly as described in claim 1, further comprising a force compliant electrical contact assembly between the interface block and the replaceable heated end effector.

7. In a high speed machine for picking and placing electronic components, a heated nozzle assembly, comprising:

a vacuum ported tool changer, a replaceable heated end effector, and an interface block;

the interface block mechanically mounted on the vacuum ported tool changer and electrically connected to the replaceable heated end effector; and the interface block having power and ground electrical contacts and temperature measuring contacts arranged to provide pluggable connections to the high speed machine.

8. The heated nozzle assembly as described in claim 7, wherein the power and ground contacts are a male connector, and wherein the temperature measuring contacts are a female connector.

9. The heated nozzle assembly as described in claim 7, further comprising a force compliant electrical contact assembly between the interface block and the replaceable heated end effector.

10. In a high speed machine for picking and placing electronic components, a heated nozzle assembly, comprising:

a vacuum ported tool changer, a replaceable heated end effector, and an interface block;

the interface block mechanically mounted on the vacuum ported tool changer and electrically connected to the replaceable heated end effector, and having one or more electrical contacts arranged to be removably connected to the high speed machine;

the replaceable heated end effector comprising an adapter flange, a heater plate and a heated tip;

said heater plate having one or more heating elements disposed thereon and arranged to thermally communicate with said heated tip;

said adapter flange having an upper side arranged to removably couple to said vacuum ported tool changer, and having one or more electrical contacts arranged to communicate with said heating elements;

said heated tip having a vacuum pickup portion for picking up said electronic components;

wherein apertures in each of said adapter flange said heater plate and said heated tip are arranged so as to communicate a vacuum from said vacuum ported tool changer to said vacuum pickup portion; and fastening means to connect said adapter flange, said heater plate and said heated tip together.

11. The heated nozzle assembly as described in claim 10, wherein the one or more electrical contacts comprise pluggable connections.

12. The heated nozzle assembly as described in claim 10, wherein the one or more electrical contacts comprise surface mount connections.

13. The heated nozzle assembly as described in claim 10, wherein the one or more electrical contacts are selected from the group consisting of power, ground, temperature measurement, pressure sensing, and optical sensors.

14. The heated nozzle assembly as described in claim 13, wherein the power and ground connections are a male connector, and wherein the temperature measurement connection is a female connector.

15. The heated noble assembly as described in claim 10, further comprising a force compliant electrical contact assembly between the interface block and the replaceable heated end effector.

\* \* \* \* \*

UNITED STATES PATENT AND TRADEMARK OFFICE
CERTIFICATE OF CORRECTION

| | | |
|---|---|---|
| PATENT NO. | : 6,837,293 B1 | Page 1 of 1 |
| APPLICATION NO. | : 10/462160 | |
| DATED | : January 4, 2005 | |
| INVENTOR(S) | : Swee Mean Mok et al. | |

It is certified that error appears in the above-identified patent and that said Letters Patent is hereby corrected as shown below:

In Column 6, Line 34, Claim No. 15:

Change "noble" to --nozzle--.

Signed and Sealed this
Seventeenth Day of May, 2011

David J. Kappos
*Director of the United States Patent and Trademark Office*